(12) United States Patent
Ohguro

(10) Patent No.: US 6,885,069 B2
(45) Date of Patent: Apr. 26, 2005

(54) SEMICONDUCTOR DEVICE IN WHICH OCCURRENCE OF SLIPS IS SUPPRESSED

(75) Inventor: Tatsuya Ohguro, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/371,834

(22) Filed: Feb. 21, 2003

(65) Prior Publication Data

US 2004/0056314 A1 Mar. 25, 2004

(30) Foreign Application Priority Data

Sep. 19, 2002 (JP) ........................................ 2002-273412

(51) Int. Cl.$^7$ ............................................... H01L 29/76
(52) U.S. Cl. ..................... 257/369; 257/531; 257/368; 257/371; 438/199; 438/223
(58) Field of Search ................. 257/369, 531, 257/368, 371; 438/199, 223

(56) References Cited

U.S. PATENT DOCUMENTS

| 4,956,693 | A | * | 9/1990 | Sawahata et al. ........... 257/611 |
| 6,261,362 | B1 | * | 7/2001 | Fujikawa et al. ............ 117/20 |
| 6,335,233 | B1 | * | 1/2002 | Cho et al. ................... 438/199 |
| 6,676,748 | B1 | * | 1/2004 | Himi et al. .................. 117/8 |

FOREIGN PATENT DOCUMENTS

JP        10303138 A  * 11/1998

OTHER PUBLICATIONS

J.N. Burghartz, et al., "Monolithic Spiral Inductors Fabricated Using a VLSI Cu–Damascene Interconnect Technology and Low–Loss Substrates," International Electron Device Meeting Digest, 1996, pp. 99–102.

C. Patrick Yue, et al., "A Physical Model for Planar Spiral Inductors on Silicon," International Electron Device Meeting Digest, 1996, pp. 155–158.

S. Meada, et al., "Impact of $^{0.82\ \mu m}$ SOI CMOS Technology using Hybrid Trench Isolation with High Resistivity Substrate on Embedded RF/Analog Applications," VLSI Technology Digest, 2000, pp. 154–155.

* cited by examiner

Primary Examiner—Nathan J. Flynn
Assistant Examiner—Remmon R. Fordé
(74) Attorney, Agent, or Firm—Frommer Lawrence & Haug LLP

(57) ABSTRACT

A substrate contains dissolved oxygen at a concentration of not more than $8\times10^{17}$ atoms/cm$^3$ and an impurity which is used as an acceptor or donor at a concentration of not more than $1\times10^{15}$ atoms/cm$^3$. In the substrate, an oxygen precipitation layer used to suppress occurrence of a slip starting from the rear surface of the substrate is formed. On the substrate, a silicon layer in which circuit elements are formed and which contains dissolved oxygen with at concentration of not more than $8\times10^{17}$ atoms/cm$^3$ and an impurity which is used as an acceptor or donor at a concentration of not more than $1\times10^{15}$ atoms/cm$^3$ is formed.

7 Claims, 6 Drawing Sheets

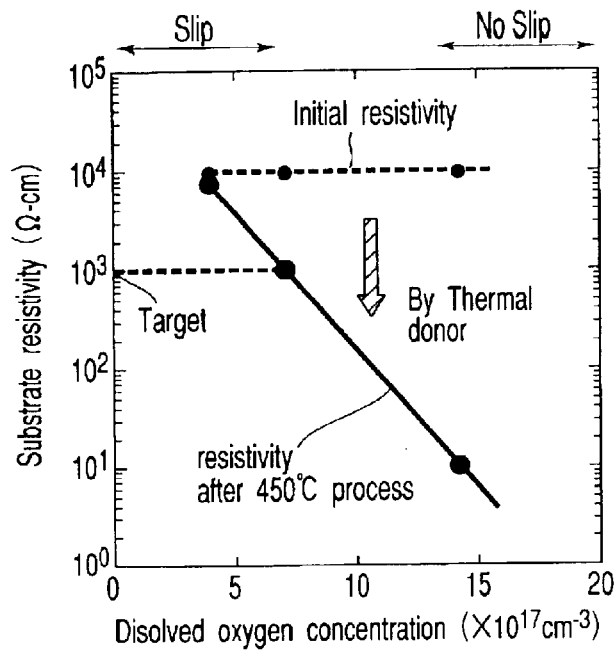
F I G. 14
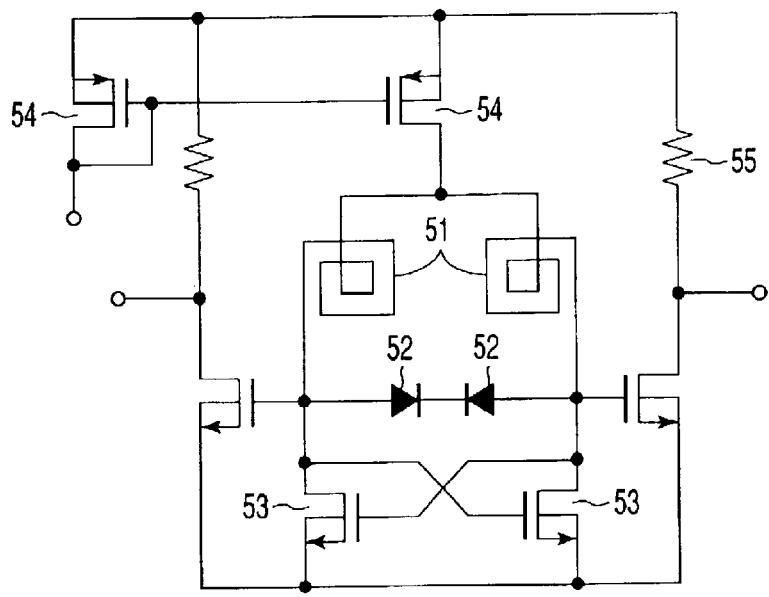
F I G. 15

SEMICONDUCTOR DEVICE IN WHICH OCCURRENCE OF SLIPS IS SUPPRESSED

CROSS-REFERENCE TO RELATED APPLICATIONS

This application is based upon and claims the benefit of priority from the prior Japanese Patent Application No. 2002-273412, filed Sep. 19, 2002, the entire contents of which are incorporated herein by reference.

BACKGROUND OF THE INVENTION

1. Field of the Invention

This invention relates to a semiconductor device comprising a high-resistance substrate with for example, a high-frequency circuit formed thereon.

2. Description of the Related Art

Recently, a system-on-a-chip comprising a semiconductor chip on which a plurality of LSIs are formed has been developed. With the development of the system-on-a-chip, not only a digital circuit and a low-frequency analog circuit, but also a high-frequency circuit are formed on a single substrate. When a high-frequency circuit is formed on a silicon substrate, it is preferable to use a substrate having a high resistance. For example, if an inductor is included in the high-frequency circuit, the Q value of the inductor can be increased. In addition, it is possible to prevent interference between the inductor and the other circuits. Also, even if a resistor or capacitor is coupled to the substrate, it is possible to prevent a signal from leaking into the substrate.

When the concentration of dissolved oxygen in the substrate is high, the oxygen is converted into a donor form and the resistance of the substrate is reduced if heat treatment is used when formatting a device. Therefore, a high-resistance substrate is formed and the concentration of dissolved oxygen in the substrate is reduced. However, if the concentration of dissolved oxygen is reduced, slips occur in the peripheral portion of the rear surface of the substrate during heat treatment. The slip starts in a portion in contact with a portion supporting the wafer used as the substrate when the wafer is heat treated in a vertical furnace. If the slip reaches a device formation region of the front surface of the wafer, a leak occurs and it becomes difficult to form a satisfactory device.

An example is given in which an SOI device is formed on a high-resistance substrate (for example, refer to 2000 SYMPOSIUM ON VLSI TECHNOLOGY Digest of Technical Papers pp. 154–155, Jun. 13–15, 2000), although this example is different from an example in which devices are formed in bulk.

Thus, to improve the performance of the high-frequency circuit, it is extremely important to increase the resistance of the substrate. However, if the concentration of dissolved oxygen in the substrate is reduced to form a high-resistance substrate, there is a risk of slips starting in portions supporting the substrate during such heat treatment as an annealing process. Therefore, there is a pressing need to develop a semiconductor device in which the occurrence of slips can be suppressed and a device can be formed on the high-resistance substrate

BRIEF SUMMARY OF THE INVENTION

According to an aspect of the invention, there is provided a semiconductor device comprising a substrate in which an oxygen precipitation layer is formed, the substrate containing dissolved oxygen at a concentration of not more than $8 \times 10^{17}$ atoms/cm$^3$ and an impurity which acts as an acceptor or donor at a concentration of not more than $1 \times 10^{15}$ atoms/cm$^3$, and a silicon layer having circuit elements is formed therein is formed on the substrate, the silicon layer containing dissolved oxygen at a concentration of not more than $8 \times 10^{17}$ atoms/cm$^3$ and an impurity which acts as an acceptor or donor at a concentration of not more than $1 \times 10^{15}$ atoms/cm$^3$.

According to another aspect of the invention, there is provided a semiconductor device comprising a substrate containing carbon at a concentration of not less than $1 \times 10^{17}$ atoms/cm$^3$, dissolved oxygen at a concentration of not more than $8 \times 10^{17}$ atoms/cm$^3$ and an impurity which acts as an acceptor or donor at a concentration of not more than $1 \times 10^{15}$ atoms/cm$^3$, and a silicon layer having circuit elements formed therein is formed on the substrate, the silicon layer containing dissolved oxygen at a concentration of not more than $8 \times 10^{17}$ atoms/cm$^3$ and an impurity which acts as an acceptor or donor at a concentration of not more than $1 \times 10^{15}$ atoms/cm$^3$.

According to another aspect of the invention, there is provided a semiconductor device comprising a substrate containing nitrogen at a concentration of not less than $1 \times 10^{14}$ atoms/cm$^3$, dissolved oxygen at a concentration of not more than $8 \times 10^{17}$ atoms/cm$^3$ and an impurity which acts as an acceptor or donor at a concentration of not more than $1 \times 10^{15}$ atoms/cm$^3$, and a silicon layer having circuit elements formed therein is formed on the substrate, the silicon layer containing dissolved oxygen at a concentration of not more than $8 \times 10^{17}$ atoms/cm$^3$ and an impurity which acts as an acceptor or donor at a concentration of not more than $1 \times 10^{15}$ atoms/cm$^3$.

According to another aspect of the invention, there is provided a semiconductor device comprising a substrate containing dissolved oxygen at a concentration of not more than $8 \times 10^{17}$ atoms/cm$^3$ and an impurity which acts as an acceptor or donor at a concentration of not more than $1 \times 10^{15}$ atoms/cm$^3$, the substrate having a first surface on which circuit elements are formed and a second surface parallel to the first surface, and an impurity layer formed on the second surface of the substrate, the impurity layer being formed within a range in contact with a supporting portion used to support the substrate during heat treatment.

According to another aspect of the invention, there is provided a semiconductor device comprising a substrate containing dissolved oxygen at a concentration of not more than $8 \times 10^{17}$ atoms/cm$^3$ and an impurity which acts as an acceptor or donor at a concentration of not more than $1 \times 10^{15}$ atoms/cm$^3$, the substrate having a first surface on which circuit elements are formed and a second surface parallel to the first surface, and an insulating film formed on the second surface of the substrate, the insulating film being formed within a range in contact with a supporting portion used to support the substrate during heat treatment.

BRIEF DESCRIPTION OF THE SEVERAL VIEWS OF THE DRAWING

FIG. 14 is a diagram showing the relationship between the concentration of dissolved oxygen in the substrate and the resistance of the substrate;

FIG. 15 is a circuit diagram showing one example of a high-frequency circuit to which the invention is applied;

DETAILED DESCRIPTION OF THE INVENTION

Embodiments of this invention will now be described with reference to the accompanying drawings.

(First Embodiment)

Figure 1:
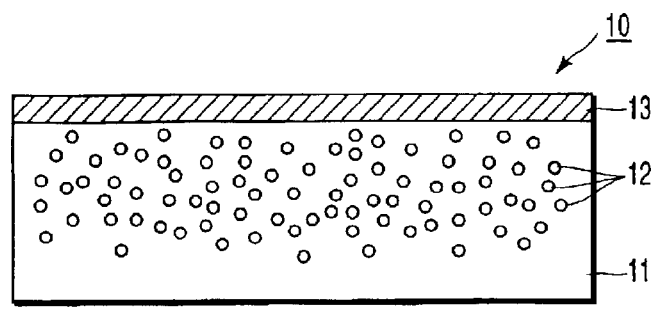
FIG. 1 is a cross-sectional view showing a semiconductor device according to a first embodiment of the invention.

FIG. 1 shows a semiconductor device 10 according to a first embodiment of the invention. The semiconductor device 10 includes a silicon substrate 11 having an oxygen precipitation layer 12 formed therein. For example, the substrate 11 is a high-resistance substrate having a resistance of 1000Ω or more.

A silicon layer 13 is formed on the surface of the substrate 11. The silicon layer 13 has a dissolved oxygen concentration of $8 \times 10^{17}$ atoms/cm$^3$ or less and an impurity concentration of $1 \times 10^{15}$ atoms/cm$^3$ or less. Since the dissolved oxygen concentration is less than or equal to $8 \times 10^{17}$ atoms/cm$^3$, the silicon layer 13 has a high resistance of 1000Ω or more, like the substrate 11. The film thickness of the silicon layer 13 is 1 μm to 10 μm, for example. The film thickness of the silicon layer 13 may be selectively set according to the depth of the device to be formed and the distance from the oxygen precipitation layer 12 to the bottom of the device, and is preferably set to 4 μm or less. An analog circuit, digital circuit and high-frequency circuit are formed in the silicon layer 13, for example.

Figure 2:
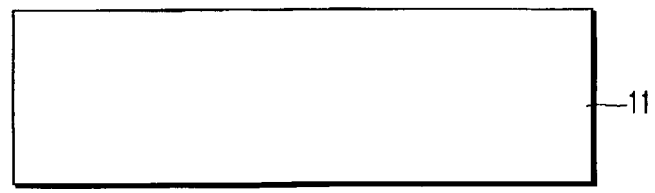
FIG. 2 is a cross-sectional view showing a manufacturing step of the semiconductor device shown in FIG. 1.
Figure 3:
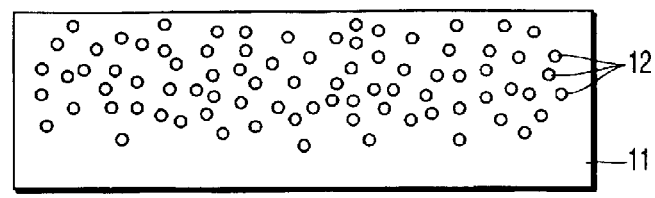
FIG. 3 is a cross-sectional view showing a manufacturing step following the step shown in FIG. 2.

FIGS. 2 and 3 show a manufacturing method of the semiconductor device 10.

FIG. 2 shows the semiconductor device 10 prior to the heat treatment. The concentration of dissolved oxygen in the substrate 11 is $1 \times 10^{18}$ atoms/cm$^3$ or more and the impurity concentration thereof is $1 \times 10^{15}$ atoms/cm$^3$ or less, for example. By annealing the substrate 11, oxygen is precipitated. In the annealing process for the precipitation of oxygen, the temperature is set at 1000° C. or more; and the processing time, 10 hours or more. That is, the conditions are so set that the concentration of dissolved oxygen in the substrate 11 after the annealing process will be less than or equal to $8 \times 10^{17}$ atoms/cm$^3$.

FIG. 3 shows a state in which the oxygen precipitation layer 12 appears in the substrate 11. After this, as shown in FIG. 1, a silicon layer 13 is formed on the substrate 11 by means of an epitaxial growth method, for example. The silicon layer 13 thus formed has the above dissolved oxygen and impurity concentrations. The dissolved oxygen concentration is determined according to the dissolved oxygen concentration of the substrate and the impurity concentration is controlled according to the concentration of mixed gas when the epitaxial growth method is performed, for example. Then, a device containing for example, a high-frequency circuit, is formed using the above substrate.

Dissolved oxygen refers to oxygen in which oxygen atoms are scattered in a silicon crystal; precipitation oxygen refers to a chemical compound formed by oxygen atoms reacting with silicon. Therefore, precipitation oxygen is stable and is not converted into a donor form by heat treatment. The precipitation oxygen in the substrate can be easily detected using a scanning electron microscope.

According to the first embodiment, the precipitation oxygen layer 12 is formed in the substrate having high resistance. The precipitation oxygen layer 12 suppresses extension of a slip when the substrate is subjected to heat treatment. Therefore, a slip on the rear surface of the substrate 11 can be prevented from reaching the front surface.

The precipitation oxygen layer 12 is formed in the substrate 11 by making the concentration of dissolved oxygen in the substrate higher than normal and so causing the dissolved oxygen to precipitate. In addition, the precipitation oxygen is not converted into donor form. Therefore, the substrate 11 can have the desired high resistance after the precipitation oxygen layer 12 has been formed.

Further, a semiconductor device with excellent high-frequency characteristics can be formed by forming on the substrate 11 a silicon layer 13 having high resistance, like the substrate 11, and forming a device using the substrate having the silicon layer 13.

(Second Embodiment)

Figure 4:
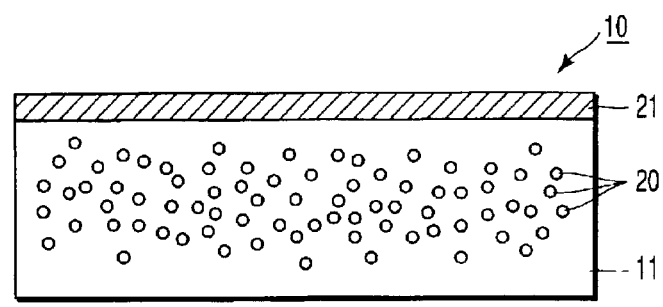
FIG. 4 is a cross-sectional view showing a semiconductor device according to a second embodiment of the invention.
Figure 5:
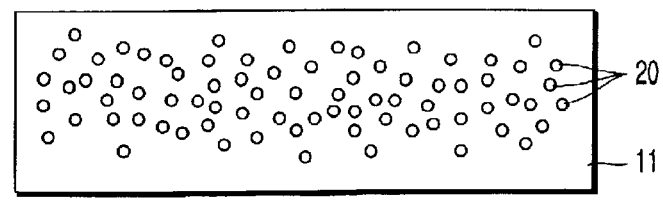
FIG. 5 is a cross-sectional view showing a manufacturing step of the semiconductor device shown in FIG. 4.

FIGS. 4 and 5 show a second embodiment of the invention.

In the semiconductor device 10 shown in FIG. 4, for example, a silicon substrate 11 contains an impurity 20 such as carbon which does not act as an acceptor or donor for the silicon. The concentration of carbon is $1 \times 10^{16}$ atoms/cm$^3$ or more, for example, and preferably $5 \times 10^{17}$ atoms/cm$^3$ or more. Further, the concentration of dissolved oxygen in the substrate 11 is $8 \times 10^{17}$ atoms/cm$^3$ or less, for example, and the concentration of an impurity which acts as an acceptor or donor is $1 \times 10^{15}$ atoms/cm$^3$ or less, for example. Since the concentration of dissolved oxygen in the substrate 11 is less than or equal to $8 \times 10^{17}$ atoms/cm$^3$, the substrate 11 has a high resistance of 1000Ω, for example.

A silicon layer 21 is formed on the substrate 11. For example, the silicon layer 21 contains carbon at a concentration of $1 \times 10^{17}$ atoms/cm$^3$ or less, dissolved oxygen at a concentration of $8 \times 10^{17}$ atoms/cm$^3$ or less, and an impurity which acts as an acceptor or donor. The impurity concentration is $1 \times 10^{15}$ atoms/cm$^3$ or less, for example. Since the dissolved oxygen concentration is less than or equal to $8 \times 10^{17}$ atoms/cm$^3$, the silicon layer 21 also has a high resistance of 1000Ω or more. The film thickness of the silicon layer 21 is 1 μm to 10 μm, for example, and is preferably 4 μm or less. An analog circuit, digital circuit and high-frequency circuit, for example, are formed in the silicon layer 21.

FIG. 5 shows a manufacturing method of the semiconductor device of FIG. 4.

First, for example, carbon used as the impurity 20 and an impurity acting as an acceptor or donor are doped into the substrate 11. Various impurity doping methods are possible. For example, the impurity can be doped into a wafer when the wafer is formed, or it can be doped into the wafer by means of an ion implantation technique, for example, after the wafer has been formed.

After this, as shown in FIG. 4, a silicon layer 21 is formed on the substrate 11 by means of an epitaxial growth method, for example. The silicon layer 21 thus formed has the above dissolved oxygen and impurity concentrations. The dissolved oxygen concentration is determined according to the dissolved oxygen concentration of the substrates, and the impurity and carbon concentrations are controlled according to the concentration of mixed gas when the epitaxial growth method is performed, for example. In this case, it is preferable that the concentration of carbon in the silicon layer 21 becomes lower.

According to the second embodiment, the substrate 11 having a high resistance of 1000Ω, for example, contains carbon at a concentration of $5 \times 10^{16}$ atoms/cm$^3$ or more. When the silicon substrate 11 contains carbon, a slip in the substrate becomes shorter as the carbon concentration increases. For example, when the carbon concentration in the substrate is $5 \times 10^{16}$ atoms/cm$^3$, the length of a slip in the substrate is approximately 60 μm; but when the carbon concentration in the substrate is $1 \times 10^{17}$ atoms/cm$^3$, the length of the slip is approximately 20 μm. If the carbon concentration in the substrate is further increased, the slip becomes shorter. Therefore, occurrence of a slip can be suppressed by including carbon at a concentration of $5 \times 10^{16}$ atoms/cm$^3$ or more in the substrate 11 of high resistance.

In addition, a semiconductor device which has excellent high-frequency characteristics can be formed by forming on the substrate 11 a silicon layer 21 having a high resistance, like the substrate 11, and forming a device using the substrate 11 having the silicon layer 21.

(Third Embodiment)

Figure 6:
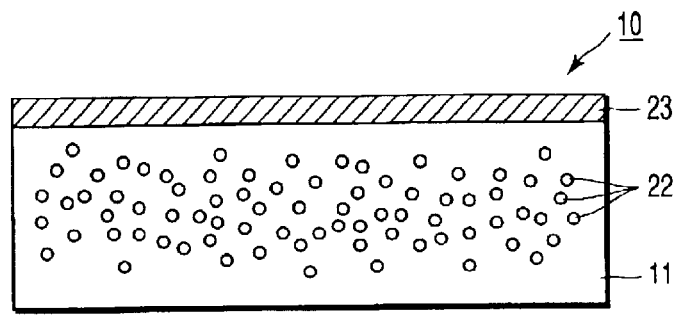
FIG. 6 is a cross-sectional view showing a semiconductor device according to a third embodiment of the invention.
Figure 7:
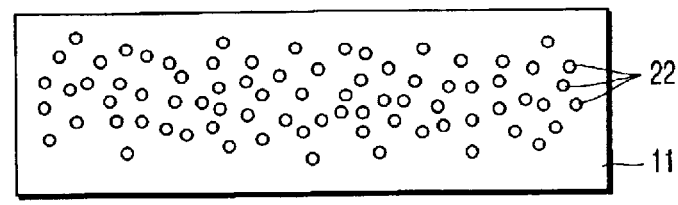
FIG. 7 is a cross-sectional view showing a manufacturing step of the semiconductor device shown in FIG. 6.

FIGS. 6 and 7 show a third embodiment of the invention. While, in the second embodiment, the substrate 11 contains carbon, in the third embodiment, the substrate 11 contains nitrogen.

In the semiconductor device 10 shown in FIG. 6, for example, the silicon substrate 11 contains an impurity 22 such as nitrogen which does not acts as an acceptor or donor for silicon. The concentration of nitrogen is $5 \times 10^{13}$ atoms/cm$^3$ or more. Further, the dissolved oxygen concentration in the substrate 11 is $8 \times 10^{17}$ atoms/cm$^3$ or less, for example, and the concentration of an impurity which is used as an acceptor or donor is $1 \times 10^{15}$ atoms/cm$^3$ or less, for example. Since the concentration of dissolved oxygen in the substrate 11 is less than or equal to $8 \times 10^{17}$ atoms/cm$^3$, the substrate 11 has a high resistance of 1000Ω or more, for example.

A silicon layer 23 is formed on the substrate 11. For example, the silicon layer 23 contains nitrogen having a concentration of $5 \times 10^{13}$ atoms/cm$^3$ or less, dissolved oxygen at a concentration of $8 \times 10^{17}$ atoms/cm$^3$ or less, and an impurity which is used as an acceptor or donor. The impurity concentration is $1 \times 10^{15}$ atoms/cm$^3$ or less, for example. Since the dissolved oxygen concentration is less than or equal to $8 \times 10^{17}$ atoms/cm$^3$, the silicon layer 23 also has a high resistance of 1000Ω or more. The film thickness of the silicon layer 23 is 1 μm to 10 μm, for example, and is preferably 4 μm or less. An analog circuit, digital circuit and high-frequency circuit are formed on the substrate 11 having the silicon layer 23, for example.

FIG. 7 shows a manufacturing method of the semiconductor device of FIG. 6.

First, for example, nitrogen used as the impurity 22 and an impurity used as an acceptor or donor are doped into the substrate 11. Various impurity doping methods are possible. For example, impurity can be doped into a wafer when the wafer is formed, or impurity can be doped into a wafer by means of an ion implantation technique, for example, after the wafer has been formed.

After this, as shown in FIG. 6, a silicon layer 23 is formed on the substrate 11 by means of an epitaxial growth method, for example. The thus formed silicon layer 23 has the above dissolved oxygen and impurity concentrations. The dissolved oxygen concentration is determined according to the dissolved oxygen concentration of the substrate and the impurity concentration and nitrogen concentration are controlled according to the concentration of mixed gas when the epitaxial growth method is performed, for example. In this case, it is more preferable as the concentration of nitrogen in the silicon layer 21 becomes lower. An analog circuit, digital circuit and high-frequency circuit are formed on the substrate 11 having the silicon layer 23, for example.

According to the third embodiment, the same effect as that obtained in the second embodiment can be attained. That is, when the silicon substrate 11 containing nitrogen is used, a slip in the substrate becomes shorter as the nitrogen concentration increases. For example, when the nitrogen concentration in the substrate is $5 \times 10^{13}$ atoms/cm$^3$, the length of a slip in the substrate is approximately 60 μm; but when the nitrogen concentration in the substrate is $1 \times 10^{15}$ atoms/cm$^3$, the length of the slip is approximately 55 μm. If the nitrogen concentration in the substrate is further increased, the slip becomes shorter. Therefore, occurrence of a slip can be suppressed by including nitrogen at a concentration of $5 \times 10^{13}$ atoms/cm$^3$ or more in the substrate 11 of high resistance.

(Fourth Embodiment)

Figure 8:
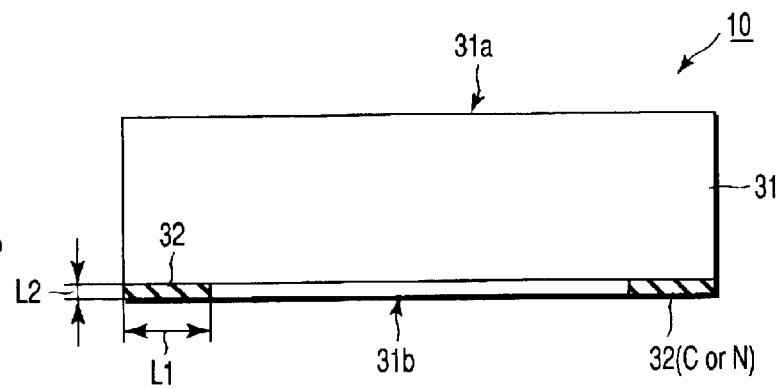
FIG. 8 is a cross-sectional view showing a semiconductor device according to a fourth embodiment of the invention.
Figure 9:
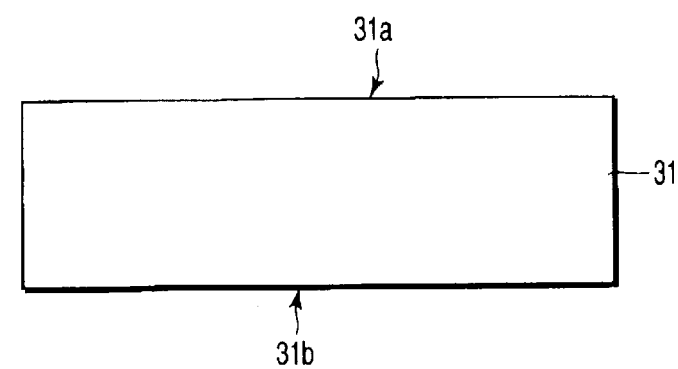
FIG. 9 is a cross-sectional view showing a manufacturing step of the semiconductor device shown in FIG. 8.
Figure 10:
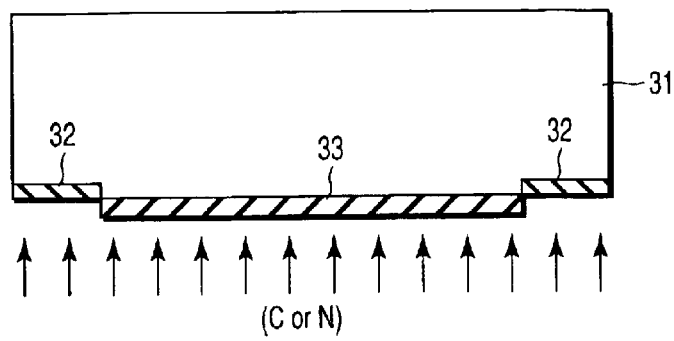
FIG. 10 is a cross-sectional view showing a manufacturing step following the step shown in FIG. 9.

FIGS. 8, 9 and 10 show a fourth embodiment of the invention.

In FIG. 8, a silicon substrate 31 contains dissolved oxygen at a concentration of $8 \times 10^{17}$ atoms/cm$^3$ or less and impurity which is used as an acceptor or donor at a concentration of $1 \times 10^{15}$ atoms/cm$^3$ or less. Since the dissolved oxygen concentration is less than or equal to $8 \times 10^{17}$ atoms/cm$^3$, the substrate 31 has a high resistance of 1000Ω or more, for example. Circuit elements (not shown) are formed on the front surface (first surface) 31a of the substrate 31. An impurity layer 32 is formed on the outer peripheral portion of the rear surface (second surface) 31b which is parallel to the front surface 31a. The position at which the impurity layer 32 is formed is determined according to the portion of the substrate 31 with which a supporting portion is set in contact at during the heat treatment carried out when manufacturing the device, for example. Generally, the supporting portion contacts the rear surface of the substrate 31. Therefore, the impurity layer 32 is formed by doping an impurity such as carbon or nitrogen which is not used as an acceptor or donor with respect to silicon. The width L1 and depth L2 of the impurity layer 32 are determined according to the range of the substrate 31 in which the supporting portion contacts the substrate. Therefore, the width L1 must be larger than the range in which the supporting portion contacts the substrate. More specifically, the width L1 is set to 3 mm to 8 mm, and is generally set to approximately 5 mm, and the depth L2 is set to 1 µm to 2 µm, for example.

As impurity to be doped, carbon or nitrogen is used, for example. The concentration is $5 \times 10^{16}$ atoms/cm$^3$ or more if carbon is used, and the concentration is $5 \times 10^{13}$ atoms/cm$^3$ or more if nitrogen is used.

FIGS. 9 and 10 show a fabrication method of the substrate.

In FIG. 9, the silicon substrate 31 contains dissolved oxygen at a concentration of $8 \times 10^{17}$ atoms/cm$^3$ or less and an impurity which is used as an acceptor or donor at a concentration of $1 \times 10^{15}$ atoms/cm$^3$ or less. A mask is formed on the rear surface 31b of the substrate 31.

FIG. 10 shows a mask 33 formed on the rear surface 31b of the substrate 31. The mask 33 exposes a region of the width L1 from the outer edge portion of the substrate 31. Carbon or nitrogen is ion-implanted into the rear surface portion 31b of the substrate 31 by use means the mask 33. The ion-implantation process is performed at a concentration of $5 \times 10^{16}$ atoms/cm$^3$ or more if carbon is used, and at a concentration of $5 \times 10^{13}$ atoms/cm$^3$ or more if nitrogen is used. After this, the mask 33 is removed and the substrate shown in FIG. 8 is completed. An analog circuit, digital circuit and high-frequency circuit are formed on the front surface of the substrate 31 having the high resistance, for example.

According to the fourth embodiment, the impurity layer 32 is formed on the rear surface of the substrate 31 having high resistance in a position corresponding to the portion of the substrate in contact with the supporting portion during annealing. Therefore, a slip in the substrate 31 during annealing can be prevented. Thus, since a slip which reaches the front surface region of the substrate 31 is not formed, a semiconductor device whit excellent high-frequency characteristics can be formed by forming a device using the substrate 31.

(Fifth Embodiment)

Figure 11:
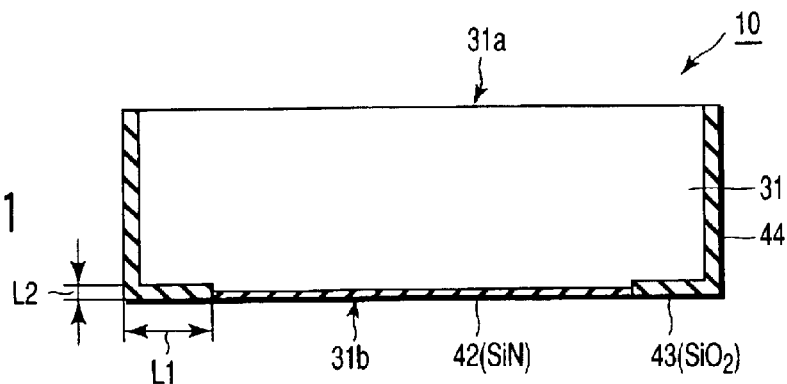
FIG. 11 is a cross-sectional view showing a semiconductor device according to a fifth embodiment of the invention.
Figure 12:
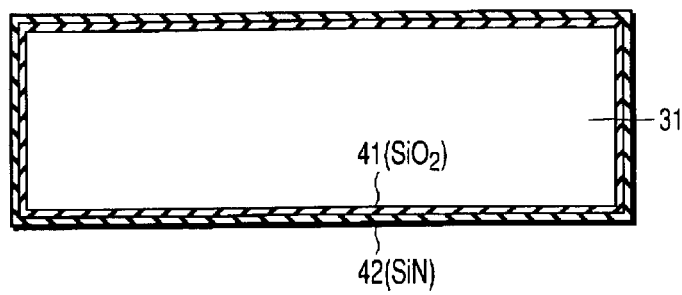
FIG. 12 is a cross-sectional view showing a manufacturing step of the semiconductor device shown in FIG. 11.
Figure 13:
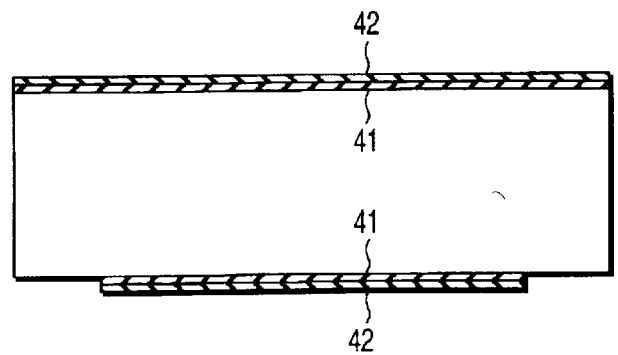
FIG. 13 is a cross-sectional view showing a manufacturing step following the step shown in FIG. 12.

FIGS. 11, 12 and 13 show a fifth embodiment of the invention.

In FIG. 11, since the concentration of dissolved oxygen in a silicon substrate 31 is less than or equal to $8 \times 10^{17}$ atoms/cm$^3$, the substrate 31 has a high resistance of 1000Ω or more. Circuit elements not shown are formed on the front surface (first surface) 31a of the substrate 31. An oxide film 43 is formed on the outer peripheral portion of the rear surface (second surface) 31b which is parallel to the front surface 31a. The position at which the oxide film 43 is formed is determined according to the portion of the substrate 31 in contact with the supporting portion during the heat treatment performed when manufacturing the device, for example. Therefore, the oxide film 43 is formed in a range larger than the area in contact with the supporting portion. For example, a nitride film 42 is formed on a portion of the substrate 31 on which the oxide film 43 is not formed. Further, an oxide film 44 is formed in connection with the oxide film 43 on the peripheral surface of the substrate 31. The width L1 and depth L2 of the oxide film 43 are the same as those in the case of the fourth embodiment.

FIGS. 12 and 13 show a fabrication method of the substrate.

In FIG. 12, the silicon substrate 31 contains dissolved oxygen at a concentration of $8 \times 10^{17}$ atoms/cm$^3$ or less and an impurity which is used as an acceptor or donor at a concentration of $1 \times 10^{15}$ atoms/cm$^3$ or less. An oxide film 41 is formed on the front surface, rear surface and peripheral surfaces of the substrate 31. The oxide film 41 is formed by subjecting the substrate 31 to thermal oxidation, for example. A film used as an anti-oxidation film, such as a silicon nitride film 42, is formed on the entire surface of the oxide film 41.

Next, as shown in FIG. 13, portions of the oxide film 41 and silicon nitride film 42 which lie on the peripheral surface of the substrate 31 and in the range with which the supporting portion contacts are removed by patterning the oxide film 41 and silicon nitride film 42. That is, the peripheral surface of the substrate 31 and the outer peripheral portion of the rear surface are exposed.

After this, the substrate 31 is subjected to thermal oxidation by the LOCOS method to form oxide films 43, 44. Then, as shown in FIG. 11, portions of the oxide film 41 and silicon nitride film 42 which lie on the front surface of the substrate 31 are removed. Next, for example, an analog circuit, digital circuit and high-frequency circuit are formed on the front surface of the substrate 31 having high resistance.

According to the fifth embodiment, the oxide film 43 is formed on the rear surface of the substrate 31 having high resistance in a position corresponding to the portion of the substrate in contact with the supporting portion during annealing. Therefore, a slip in the substrate 31 during annealing can be prevented. Thus, since a slip which reaches the front surface region of the substrate 31 is not formed in the substrate 31, a semiconductor device with excellent high-frequency characteristics can be formed by forming a device by use of the substrate 31.

FIG. 14 shows the relationship between the concentration of dissolved oxygen in the substrate and the resistance of the substrate. As shown in FIG. 14, the resistance decreases as the concentration of dissolved oxygen in the substrate increase. However, the rate of occurrence of a slip is reduced. Conversely, the resistance increases as the concentration of dissolved oxygen in the substrate decreases. However, the rate of occurrence of a slip is increased.

In the first to fifth embodiments, the concentration of dissolved oxygen in the substrate is reduced to increase the resistance of the substrate. In the first embodiment, to suppress a slip in the substrate, the oxygen precipitation layer is formed and, in the second and third embodiments, an impurity which is not used as the acceptor or donor is doped into the substrate. Further, in the fourth and fifth embodiments, the impurity layer or oxide film is formed on the rear surface of the substrate and the outer peripheral portion thereof to prevent a slip.

In the first to fifth embodiments, the concentration of dissolved oxygen in the substrate is made less than or equal to $8 \times 10^{17}$ atoms/cm$^3$. Therefore, the resistance of the substrate is set to 1000Ω or more. When a high-frequency circuit is formed, it is more preferable that the resistance of the substrate be made higher. However, depending on the application thereof, it is possible to use a substrate having a resistance of approximately 500Ω. As can be clearly seen from FIG. 14, it is possible to attain a resistance of 500Ω by making the concentration of dissolved oxygen in the substrate $8 \times 10^{17}$ atoms/cm$^3$ or less.

FIG. 15 shows a voltage controlled oscillator as one example of a high-frequency circuit formed on the substrate 11, 31 having high resistance. The voltage-controlled oscillator includes a spiral-form inductor 51, variable-capacitance diode 52, a plurality of N-channel MOSFETs 53, a plurality of P-channel MOSFETs 54 and a resistor 55.

Figure 16:
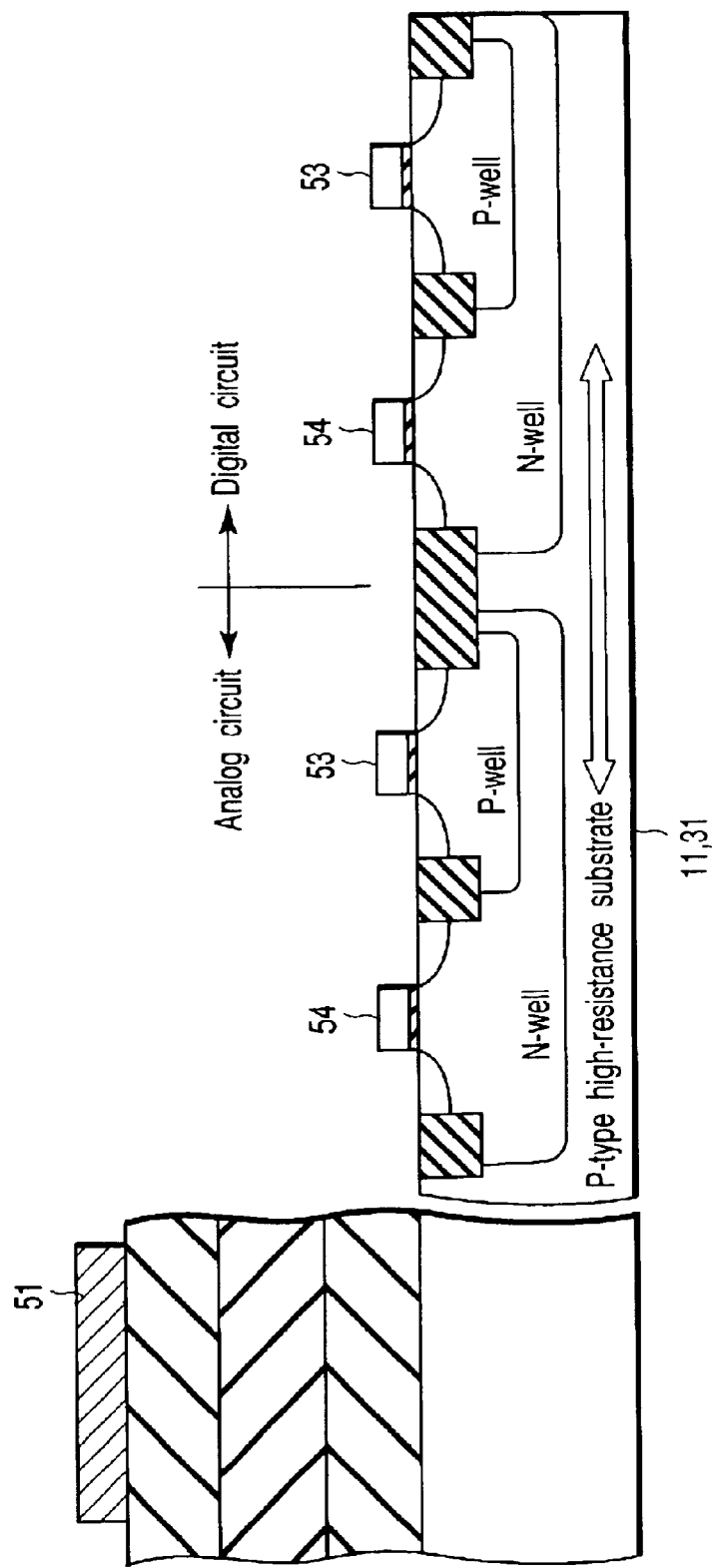
FIG. 16 is a cross-sectional view showing part of a digital/analog mixing integrated circuit to which the invention is applied.

FIG. 16 schematically shows part of a digital/analog mixing integrated circuit using the voltage-controlled oscillator shown in FIG. 15. Circuit elements configuring the integrated circuit are formed on the substrate 11, 31 or in the silicon layer 13, 21, 23. That is, the circuit elements are formed in the bulk of the high-resistance substrate. Thus, by forming the circuit elements in the high-resistance substrate, substrate noise can be reduced and noise from the digital circuit can be kept out of the analog circuit.

Figure 17:
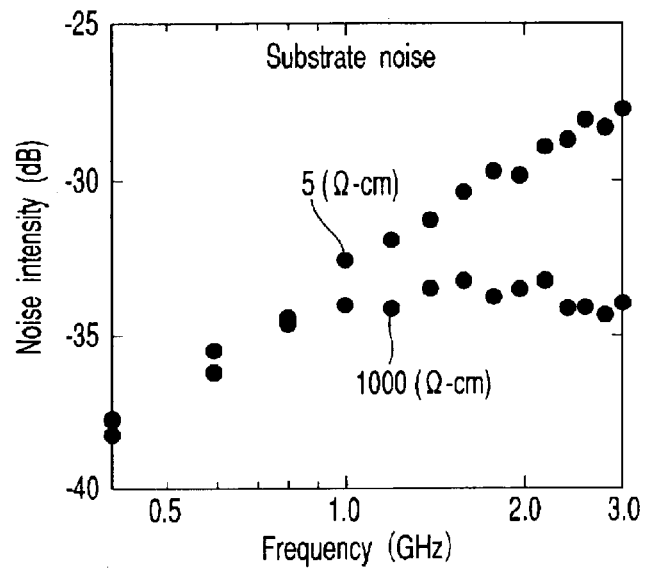
FIG. 17 is a diagram showing the relationship between the resistance of the substrate and substrate noise.

FIG. 17 shows the relationship between the resistance of the substrate and substrate noise. The characteristic diagram is obtained by plotting against frequency the intensity of the signal between the well in which the digital circuit is formed and the well in which the analog circuit is formed. As can be clearly seen from FIG. 17, when the resistivity of the substrate is 1000 Ω-cm, the noise reduction effect with respect to the high-frequency signal is large in comparison with the case wherein the resistivity is 5 Ω-cm.

Further, as shown in FIG. 16, the inductor 51 is formed in a region in which the well of the substrate 11, 31 is not formed. The resistance of the well is lower than the resistance of the substrate. Therefore, the Q value of the inductor can be increased by forming the inductor 51 in the region in which the well of the substrate 11, 31 is not formed and which has high resistance.

Figure 18:
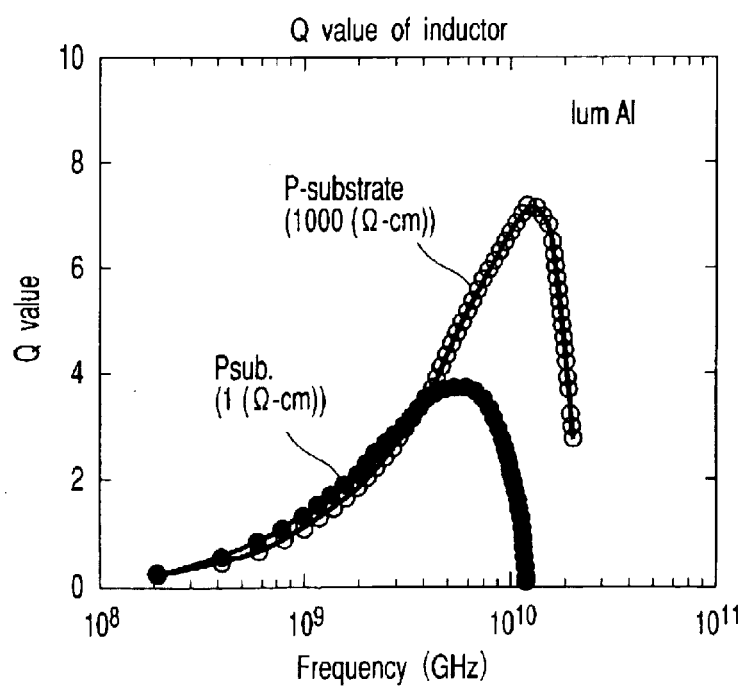
FIG. 18 is a diagram showing the relationship between the resistance of the substrate and Q of an inductor.

FIG. 18 shows the relationship between the resistance of the substrate and Q of the inductor. It can be clearly seen from FIG. 18 that an inductor formed in the substrate of resistivity 1000 Ω-cm has a larger Q value than an inductor formed in the substrate of resistivity 1 Ω-cm.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a substrate containing carbon at a concentration of not less than $1\times10^{17}$ atoms/cm$^3$, dissolved oxygen at concentration of not more than $8\times10^{17}$ atoms/cm$^3$ and an impurity which is used as an acceptor or donor at a concentration of not more than $1\times10^{15}$ atoms/cm$^3$, and a silicon layer formed on the substrate and having circuit elements formed therein, the silicon layer containing dissolved oxygen at a concentration of not more than $8\times10^{17}$ atoms/cm$^3$ and an impurity which is used as an acceptor or donor at a concentration of not more than $1\times10^{15}$ atoms/cm$^3$.

2. A device according to claim 1, wherein the film thickness of the silicon layer is 1 μm to 10 μm.

3. A device according to claim 1, wherein the film thickness of the silicon layer is not more than 4 μm.

4. A device according to claim 1, wherein the silicon layer is an epitaxial layer.

5. A device according to claim 1, wherein the circuit elements include an inductor formed in a region which is formed above the substrate and in which no well is formed.

6. The device according to claim 1, wherein the substrate and the silicon layer have high resistance.

7. The device according to claim 2, wherein resistance of the substrate and the silicon layer is 100Ω or more.

* * * * *